United States Patent [19]
Marton

[11] Patent Number: 4,814,707
[45] Date of Patent: Mar. 21, 1989

[54] SCALAR MAGNETOMETER WITH VECTOR CAPABILITIES

[75] Inventor: Bela I. Marton, Allen, Tex.

[73] Assignee: Texas Instruments Incorporated, Dallas, Tex.

[21] Appl. No.: 64,281

[22] Filed: Jun. 17, 1987

[51] Int. Cl.[4] .......................................... G01R 33/26
[52] U.S. Cl. .................................... 324/304; 324/301
[58] Field of Search ............... 324/300, 301, 302, 304, 324/307, 318, 322

[56] References Cited

U.S. PATENT DOCUMENTS

| | | | |
|---|---|---|---|
| 3,103,621 | 9/1963 | Fraser | 324/302 |
| 3,714,552 | 1/1973 | Hirschel | 324/301 |
| 4,567,439 | 1/1986 | McGregor | 324/301 |

Primary Examiner—Michael J. Tokar
Attorney, Agent, or Firm—Ferdinand M. Romano; James T. Comfort; Melvin Sharp

[57] ABSTRACT

A scalar magnetometer with vector capabilities includes a cell containing $^3$He gas at a pressure between 0.05 Torr and 100 Torr. The cell is energized by an oscillator which partially ionizes the $^3$He gas. Metastable atoms are polarized and consequently ground state atoms are polarized with a radiation source. A pair of Helmholtz coils provides a small uniform magnetic field which initiates a precession of the polarized $^e$He atoms by forcing their misalignment with the magnetic field to be measured. The angular velocity of the precession is proportional to the strength of the field. A voltage is induced in a plurality of coils that are mounted on the axes of the cell. The induced voltage provides vector information for identifying the angular position of the cell relative to the magnetic field being measured.

22 Claims, 2 Drawing Sheets

SCALAR MAGNETOMETER WITH VECTOR CAPABILITIES

BACKGROUND OF THE INVENTION

This invention relates to magnetometers and more particularly to helium scalar magnetometers with vector capabilities including rotational compensation.

Conventional helium magnetometers use a $^4$He lamp (a tube containing $^4$He gas which is excited by an rf discharge so that it glows) to provide radiation to polarize either the $^4$He metastable atoms or ground state $^3$He atoms in the cell. The physics of this process is known in the art. See U.S. Pat. Nos.: 4,567,439 and 3,206,761. See also:

P. A. Franken and F. D. Colegrove, *Physics Review Letters* 1, 317 (1958);

F. D. Colegrove and P. A. Franken *Physics Review* 119, 680 (1960); and

F. D. Colegrove, L. D. Schearer and G. K. Walters, *Physics Review* 132, 2561 (1963).

Conventional helium magnetometers when mounted and used in a rotational device such as a floating container or buoy have an induced error caused by the rotational motion.

SUMMARY OF THE INVENTION

A scalar magnetometer with vector capabilities includes a cell containing $^3$He gas at a pressure >0.05 Torr and <100 Torr. The cell is energized by a cell oscillator which partially ionizes the $^3$He gas that is contained within the cell. The metastable atoms are polarized and consequently the ground state atoms are polarized by the radiation source. A pair of Helmholtz coils provide a small uniform magnetic field which initiates a precession of the polarized $^3$He atoms by forcing their misalignment with the magnetic field that is to be measured. The angular velocity of the procession is proportional to the magnetic field strength within the cell. The precessing $^3$He atoms induce a voltage in a plurality of coils that are mounted on the axes of the cell. This induced voltage provides vector information that identifies the angular position of the cell in a magnetic field that is being measured and thus enables the compensation of the measured magnetic field for rotational errors.

It is the object of this invention to provide a scalar magnetometer with vector capabilities. In the preferred embodiment a spherical cell contains $^3$He gas. At least three coils are orthogonally located around the cell. Polarization and procession is brought about within the cell through conventional methods. Due to the close proximity of the coils of the cell, containing the precessing $^3$He atoms a voltage is induced into each coil. The amplitude of the voltage is related to the angular position of the individual coil to the magnetic field that is being measured.

It is another object of this invention to provide a scalar magnetometer with vector capabilities in which the induced voltages have a vector relationship and thus, changes in orientation of the scalar magnetometer can be derived from the relative amplitudes of the induced voltages.

It is yet another object of the invention to provide a scalar magnetometer with vector capabilities in which a coil system includes two sets of high quality high Q orthogonal coils for providing a high signal to noise ratio. A third coil pair of a lower Q value and of convenient size is placed orthogonal to the two sets of high quality high Q coils. The third set of coils enables vector orientation information to be determined while with just one or two coil sets only magnetic field strength is obtainable.

It is still another object of the invention to compute the directional cosines from voltages induced in the coil pairs. The induced voltage amplitude voltage amplitude is a function of the direction of the magnetic field being measured.

BRIEF DESCRIPTION OF THE DRAWINGS

These and other advantages of the invention may be understood from a reading of the specification in conjunction with the figures wherein.

DETAILED DESCRIPTION OF THE EMBODIMENTS

Figure 1:
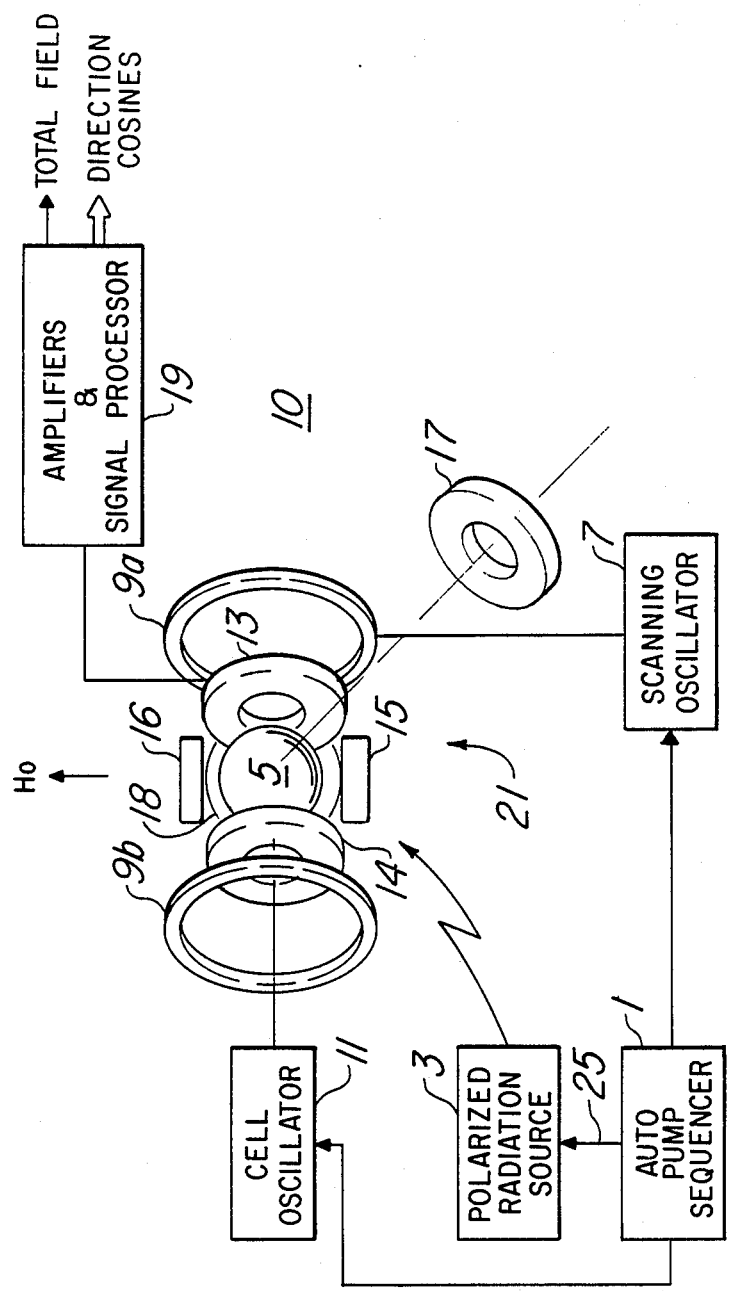
FIG. 1 is a simplified block diagram of a scalar magnetometer with vector capabilities according to the invention.

FIG. 1 is a simplified block diagram of a scalar magnetometer 10 with vector capabilities. An auto sequencer 1 causes a cell oscillator 11 to transfer energy to a cell 5 containing $^3$He gas at a low pressure of >0.05 Torr and <100 Torr. This partially ionizes the gas within the cell 5. The metastable atoms and consequently ground state atoms are polarized by radiation from a polarized source 3. The radiation source 3 may be a device such as disclosed in FIG. 2a, or as disclosed in copending application by McGregor, Ser. No. 044,914, filed 04/30/1987, assigned to the assignee of the present invention, and illustrated in partial schematic form in FIG. 2b. The auto sequencer 1 controls the ionization, and polarization of the $^3$He atoms. Precession of the polarized atoms is initiated by a scanning oscillator 7 which is triggered by the auto sequencer 1. The osillator 7 energizes a pair of Helmholtz coils 9a and 9b causing the polarized atoms within the cell 5 to precess around a magnetic field, $\vec{H}_o$. The angular velocity of the precessing polarized atoms is directly proportional the strength of the magnetic field, $\vec{H}_o$. As a result of the magnetic moment of the precessing atoms a voltage is induced in sense coils 13 through 18 that are located in close proximity to the cell 5. In the embodiment of FIG. 1, there are three pairs of sense coils. The sense coils are connected to amplifiers and a signal processor 19 to determine the total field strength and direction cosines. These vector quantities are used to identify the position of the scalar magnetometer and to compensate for changes in the measured magnetic field, $\vec{H}'_o$, due to the rotational position of the scalar magnetometer.

Figure 2A:
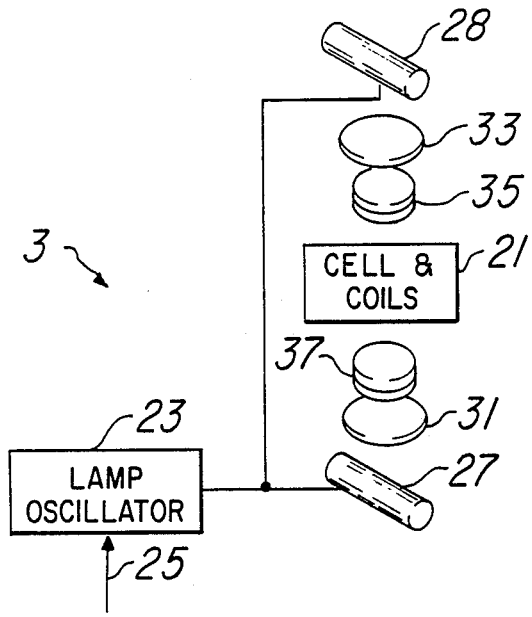
FIGS. 2a and 2b are simplified block diagrams of the polarized radiation source of FIG. 1.
Figure 2B:
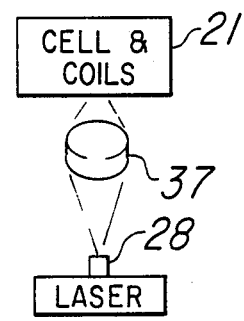

In FIG. 2a the helium cell 5 and sense coils 13 through 18 of FIG. 1 are designated as a cell and coil assembly 21. FIG. 2a illustrates a method of energizing the cell 5. A lamp oscillator 23 is connected to the auto sequencer 1 via cable 25 and provides radio frequency energy to a pair of $^3$He gas lamps 27 and 28. Lamp radiation is focused with lenses 31 and 33 and is circularly polarized with lenses 35 and 37. The circularly polarized lamp radiation polarizes the $^3$He atoms within the cell and coil assembly 21. Alternately, FIG. 2b illustrates a laser 28 having the appropriate wavelength of approximately 1.083 micrometers to insure polarization. The laser radiation may be circularly polarized with polarizing plate 37 before striking the cell 5.

Figure 3:
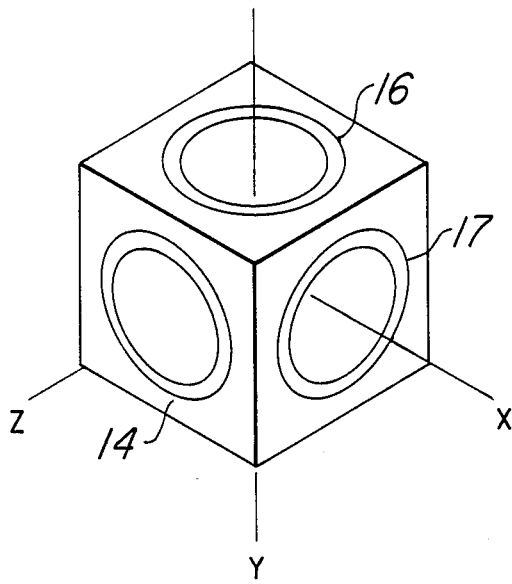
FIG. 3 is a simplified diagram illustrating the orthogonal placement of the pickup coils around the cell of FIG. 1.
Figure 4:
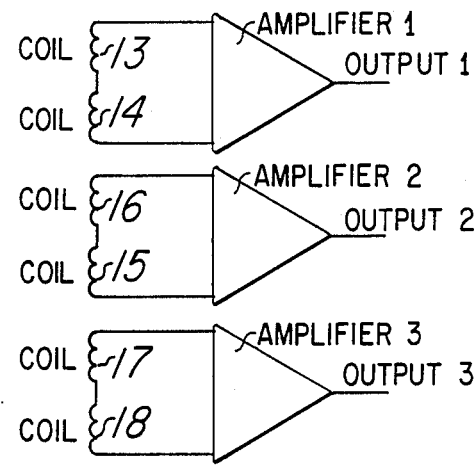
FIG. 4 is a simplified schematic showing the connection of the orthogonal coils according to the embodiment of FIG. 1.

The coils 13–18 are orthogonally positioned about the cell 5 as is graphically illustrated in FIG. 3. The preferred embodiment includes 3 coil pairs. However, the scalar magnetometer 10 will operate with 3 single coils, i.e. one located on each axis (X, Y and Z). In the preferred 3 coil pair embodiment, each orthogonal coil pair is connected across the inputs of a differential amplifier to obtain and amplify induced voltages. This circuit arrangement is shown in FIG. 4 to which pairs of coils 13 and 14, 15 and 16 and 17 and 18 are connected in series to an amplifier. Amplified outputs 1, 2 and 3 are processed (according to the equations presented in the following table of equations) by the signal processor of device 19.

The induced output voltages 1, 2 and 3 are described by equations 1, 2 and 3 of the Table, i.e. $V_x$, $V_y$ and $V_z$.

TABLE OF EQUATIONS

1. $V_x = K_1 \sin\alpha \cos(\omega t + \phi_x)$
2. $V_y = K_2 \sin\beta \cos(\omega t + \phi_y)$
3. $V_z = K_3 \sin\gamma \cos(\omega t + \phi_z)$
4. $\omega = \gamma_{He^3} H_0$
5. $|V_x| = |\sin\alpha|$
6. $|V_y| = |\sin\beta|$
7. $|V_z| = |\sin\gamma|$
8. $\dfrac{\vec{He}}{|He|} = \cos\alpha\,\vec{x} + \cos\beta\,\vec{y} + \cos\gamma\,\vec{z}$
9. $\dfrac{\vec{He}}{|He|} = \mathrm{sgn}\,[\phi_z - \phi_y] \cdot |\cos\alpha|\vec{x} + \mathrm{sgn}\,[\phi_x - \phi_z] \cdot |\cos\beta|\vec{y} \pm |\cos\gamma|\vec{z}$
10. Where sgn $[n] = -1$ if n is negative and $+1$ if n is positive.

The rotational velocity of the precessing atoms within the cell 5 is represented as $\omega$ with the induced voltages $V_x$, $V_y$ and $V_z$ the magnitude and direction of the magnetic field $\vec{H}_o$ is obtained through equations 4–9. In equation 4, $\gamma He^3$ is the gyromagnetic ratio for $^3$He gas. The magnitude of the directional cosines are obtained from equations 5, 6 and 7 in which the amplitudes $K_1$, $K_2$, and $K_3$ have been adjusted to be unity.

The standard form of the directional cosines is shown in equation 8 and is computed using equations 9. In equation 9 $|\cos\alpha|$, $|\cos\beta|$ and $|\cos\gamma|$ are the magnitude of the directional cosines. The sense of the first two directional cosines of equation 9 are obtained through their phase relationship between the induced voltages, $V_x$, $V_y$, and $V_z$. The sense of the third directional cosine is determined from the knowledge of the position of the scalar magnetometer 10 in the magnetic field that is being measured. For example, when the magnetometer is mounted in an ocean deployed buoy, the third cosine will be negative when the buoy is deployed in the northern magnetic latitudes and will be positive when deployed in the southern magnetic latitudes.

Thus the rotational position of the scalar magnetometer with vector cpabilities is sensed by the time change of the directional cosines as indicated in equation 9. Equation 9 provides the rotational rate about the axis of rotation. From this data amplitude compensation can be provided to correct the value of the total measured magnetic field strength.

I claim:
1. A scalar magnetometer with vector capabilities comprising:
   a cell having orthogonal axes containing $^3$He gas at a first predetermined pressure;
   an ionization source operatively connected to the cell;
   a polarization radiation source optically connected to the cell;
   a plurality of sense coils arranged to have at least a single coil mounted on each axis of the cell; and
   a detector circuit connected to the plurality of sense coils.
2. The scalar magnetometer with vector capabilities according to claim 1 wherein the polarized radiation source comprises:
   a lamp container containing $^4$He gas;
   a radio frequency oscillator operatively connected to the lamp container; and
   a lens system operatively positioned to focused radiation from the lamp container onto the cell.
3. The scalar magnetometer with vector capabilities according to claim 1 wherein the cell comprises:
   a glass container filled with $^3$He gas at a pressure that falls in the range of $>0.05$ Torr and $<100$ Torr.
4. The scalar magnetometer with vector capabilities according to claim 1 wherein the plurality of sense coils comprises:
   three sets of coil pairs with each single coil pair being series connected and each single coil being mounted on an opposite side of the cell from the other coil of the series connected coil pair.
5. The scalar magnetometer with vector capabilities according to claim 4 wherein the detector circuit comprises:
   a first difference amplifier operatively connected to a first pair of series connected coils;
   a second difference amplifier operatively connected to a second pair of series connected coils;
   a third difference amplifier operatively connected to a third pair of series connected coils; and
   a processor operatively connected to outputs of the first, second and third difference amplifiers.
6. The scalar magnetometer with vector capabilities according to claim 1 wherein the ionization source comprises:
   an rf oscillator operatively connected to the cell.
7. The scalar magnetometer with vector capabilities according to claim 1 wherein the polarized radiation source comprises:
   a laser having a predetermined wavelength; and
   a lens system operatively positioned to focus radiation from the laser onto the cell.
8. A scalar magnetometer with vector capabilities comprising:
   a cell having orthogonal axes containing a plurality of $^3$He atoms for providing precessing magnetic moments when ionizes and placed in a magnetic field;
   ionization means for partially ionizing the plurality of $^3$He atoms;
   a plurality of sense coils arranged to have at least a single coil mounted on each axis of the cell for sensing the precessing magnetic moments to provide an induced voltage; and a detector for detecting the strength of the magnetic field from the induced voltage.

9. The scalar magnetometer with vector capabilities according to claim 8 further comprising means for polarizing the $^3$He atoms.

10. The scalar magnetometer according to claim 9 wherein the polarization means comprises:
a lamp containing $^4$He for producing radiation having a predefined wavelength when ionized;
an oscillator connected for ionizing the $^4$He atoms; and
a lens system for polarizing and focusing the radiation into the cell.

11. The scalar magnetometer according to claim 9 wherein the polarization means comprises:
a laser for providing radiation of a predetermined wavelength; and
a lens system for providing polarized and focused radiation to the cell.

12. The scalar magnetometer with vector capabilities according to claim 8 wherein the cell comprises:
a spherical glass container for containing $^3$He at a pressure that falls in the range of <0.05 Torr and <100 Torr.

13. The scalar magnetometer with vector capabilities according to claim 8 wherein the plurality of sense coils comprises:
three sets of coil pairs with each single coil pair being series connected and each single coil being mounted on an opposite side of the cell from the other coil of the series connected coil pair for inducing voltage generated by the precessing magnetic moments.

14. The scalar magnetometer with vector capabilities to claim 8 wherein the detector comprises:
a first difference amplifier operatively connected to a first pair of series connected coils for amplifying the induced voltage in the first pair of series connected coils;
a second difference amplifier operatively connected to a second pair of series connected coils for amplifying the induced voltage in the second pair of series connected coils;
a third difference amplifier operatively connected to a third pair of series connected coils for amplifying the induced voltage in the third pair of series connected coils; and
a processor connected to outputs of the first, second and third difference amplifiers for processing the amplified induced voltage.

15. The scalar magnetometer according to claim 14 wherein the processor comprises:

means for compensated for position changes of the scalar magnetometer.

16. A method for performing rotational compensation on scalar magnetometer readings comprising the steps of:
forming a cell containing a plurality of $^3$He atoms having orthogonal axes;
ionizing the $^3$He atoms;
polarizing the $^3$He atoms causing them to precess around a magnetic field;
sensing precessing magnetic moments of the atoms to provide an induced voltage with a plurality of sense coils, at least a single coil mounted on each axis of the cell;
detecting the strength of the magnetic field from the induced voltage; and
correcting the value of the detected magnetic strength based on cell rotation.

17. The method according to claim 15 wherein the step of polarizing the $^3$He atoms comprises:
energizing a lamp containing $^4$He to produce radiation having a predefined wavelength;
focusing and polarizing the radiation onto the cell means.

18. The method according to claim 16 wherein the step of polarizing the $^3$He atoms comprises:
generating polarized laser radiation having a predetermined wavelength; and
focusing the radiation into the cell.

19. The method according to claim 16 wherein the cell is a spherical glass container comprising $^3$He at a pressure ranging between 0.05 Torr and 100 Torr.

20. The method according to claim 19 wherein the step of sensing the precessing magnetic moments comprises:
inducing voltage in three sets of series connected sense coil pairs with each member of a series connected pair being mounted on an opposite side of the spherical glass container from the other member of the series connected pair.

21. The method according to claim 20 wherein the step of detecting comprises:
amplifying the induced voltage in the first pair of series connected coils;
amplifying the induced voltage in the second pair of series connected coils;
amplifying the induced voltage in the third pair of series connected coils; and
processing the amplified induced voltage.

22. The method according to claim 21 wherein the step of correcting compensates for position changes of the scalar magnetometer with the processed amplified induced voltages.

* * * * *